(12) United States Patent
Tsai et al.

(10) Patent No.: US 11,569,387 B2
(45) Date of Patent: *Jan. 31, 2023

(54) SEMICONDUCTOR DEVICE INCLUDING FIN STRUCTURES AND MANUFACTURING METHOD THEREOF

(71) Applicant: TAIWAN SEMICONDUCTOR MANUFACTURING CO., LTD., Hsinchu (TW)

(72) Inventors: Chun Hsiung Tsai, Hsinchu County (TW); Kei-Wei Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/188,779

(22) Filed: Mar. 1, 2021

(65) Prior Publication Data
US 2021/0257493 A1    Aug. 19, 2021

Related U.S. Application Data

(60) Continuation of application No. 15/974,227, filed on May 8, 2018, now Pat. No. 10,937,906, which is a
(Continued)

(51) Int. Cl.
*H01L 29/78* (2006.01)
*H01L 21/306* (2006.01)
(Continued)

(52) U.S. Cl.
CPC .... *H01L 29/7848* (2013.01); *H01L 21/26506* (2013.01); *H01L 21/306* (2013.01);
(Continued)

(58) Field of Classification Search
CPC ............. H01L 29/7842; H01L 29/7848; H01L 21/823814; H01L 21/823418; H01L 29/785
See application file for complete search history.

(56) References Cited

U.S. PATENT DOCUMENTS

9,991,384 B2 * 6/2018 Tsai .................... H01L 29/7851
2011/0147828 A1 * 6/2011 Murthy ................ H01L 29/785
257/E21.409
(Continued)

*Primary Examiner* — Wasiul Haider
(74) *Attorney, Agent, or Firm* — McDermott Will & Emery LLP (57) ABSTRACT

A semiconductor Fin FET device includes a fin structure disposed over a substrate. The fin structure includes a channel layer. The Fin FET device also includes a gate structure including a gate electrode layer and a gate dielectric layer, covering a portion of the fin structure. Side-wall insulating layers are disposed over both main sides of the gate electrode layer. The Fin FET device includes a source and a drain, each including a stressor layer disposed in a recess formed by removing the fin structure not covered by the gate structure. The stressor layer includes a first to a third stressor layer formed in this order. In the source, an interface between the first stressor layer and the channel layer is located under one of the side-wall insulating layers closer to the source or the gate electrode.

19 Claims, 7 Drawing Sheets

Related U.S. Application Data division of application No. 14/714,242, filed on May 15, 2015, now Pat. No. 9,991,384.

(60) Provisional application No. 62/104,060, filed on Jan. 15, 2015.

(51) Int. Cl.
*H01L 21/265* (2006.01)
*H01L 29/66* (2006.01)
*H01L 29/267* (2006.01)
*H01L 29/165* (2006.01)

(52) U.S. Cl.
CPC ...... *H01L 29/66795* (2013.01); *H01L 29/785* (2013.01); *H01L 29/7847* (2013.01); *H01L 29/7851* (2013.01); *H01L 29/165* (2013.01); *H01L 29/267* (2013.01)

(56) References Cited

U.S. PATENT DOCUMENTS

| | | | | |
|---|---|---|---|---|
| 2012/0091528 A1* | 4/2012 | Chang | ............... | H01L 29/66795 |
| | | | | 257/E21.409 |
| 2013/0043511 A1* | 2/2013 | Tsai | .................. | H01L 29/66636 |
| | | | | 438/300 |
| 2016/0141370 A1* | 5/2016 | Cheng | ................. | H01L 29/0649 |
| | | | | 257/347 |

* cited by examiner

SEMICONDUCTOR DEVICE INCLUDING FIN STRUCTURES AND MANUFACTURING METHOD THEREOF

RELATED APPLICATIONS

This application is a Continuation application of U.S. application Ser. No. 15/974,227 filed May 8, 2018, now U.S. Pat. No. 10,937,906, which is a Divisional application of U.S. application Ser. No. 14/714,242 filed May 15, 2015, now U.S. Pat. No. 9,991,384, which claims priority of U.S. Provisional Application No. 62/104,060 filed on Jan. 15, 2015, the entire contents of which applications are incorporated herein by reference.

TECHNICAL FIELD

The disclosure relates to a semiconductor integrated circuit, and more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the Fin FET utilizing, for example, silicon germanium (SiGe), silicon carbide (SiC), and/or silicon phosphide (SiP) may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
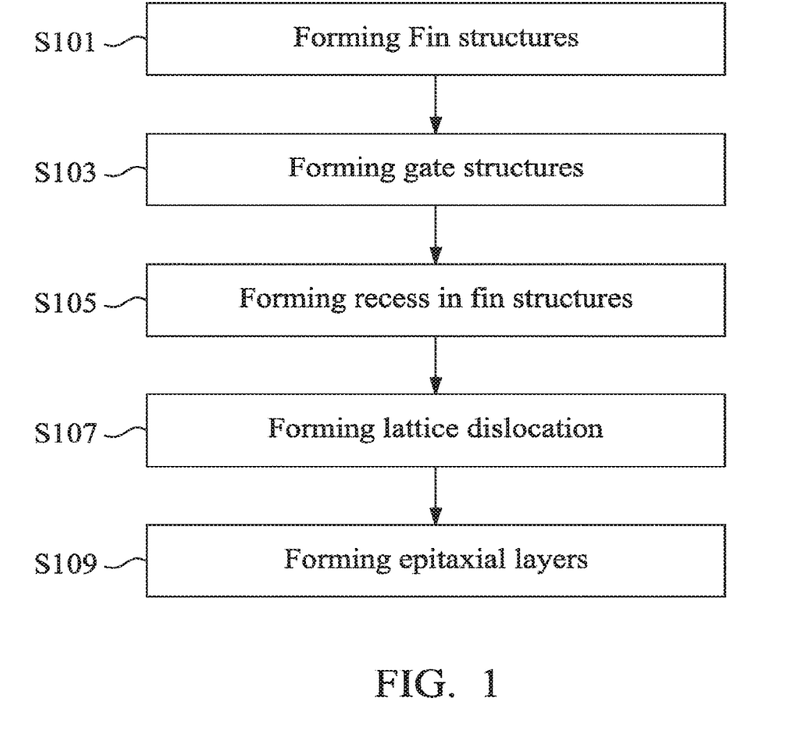
FIG. 1 is an exemplary process flow chart for manufacturing a semiconductor FET device having a fin structure (Fin FET).

FIG. 1 is an exemplary flow chart for manufacturing a semiconductor FET device having a fin structure (Fin FET). The flow chart illustrates only a relevant part of the entire manufacturing process for a Fin FET device. It is understood that additional operations may be provided before, during, and after processes shown by FIG. 1, and some of the operations described below can be replaced or eliminated for additional embodiments of the method. The order of the operations/processes may be interchangeable. The general operations for manufacturing a recessed S/D structure with strain materials (or stressor) in the fin structure are disclosed in U.S. Pat. No. 8,440,517, the entire contents of which are incorporated herein by reference.

Figure 2:
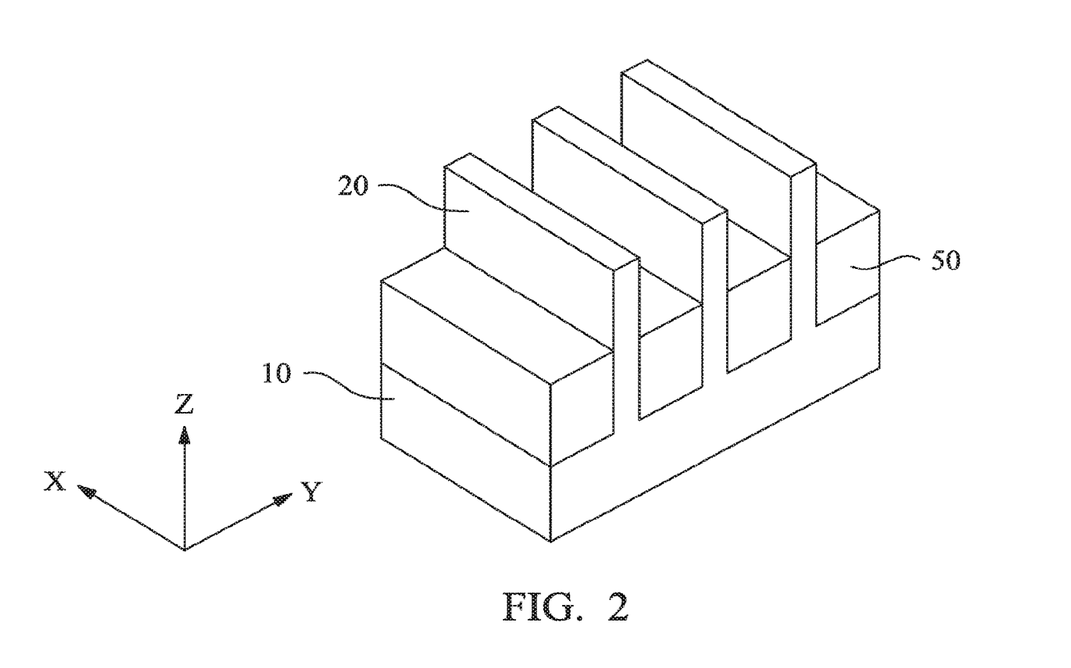
FIG. 2 shows one of the stages of manufacturing the Fin FET device according to an embodiment of the present disclosure.

In S101 of FIG. 1, a fin structure is fabricated over a substrate as shown in FIG. 2. FIG. 2 is an exemplary perspective view of the Fin FET device at one of the various stages of the fabrication process according to one embodiment.

Fin structures 20 are formed over a substrate 10 and protrude from an isolation insulating layer 50. To fabricate a fin structure, a mask layer is formed over the substrate 10 by, for example, a thermal oxidation process and/or a chemical vapor deposition (CVD) process. The substrate 10 is, for example, a p-type silicon substrate with an impurity concentration in a range of about $1\times10^{15}$ cm$^{-3}$ to about $1\times10^{18}$ cm$^{-3}$. In other embodiments, The substrate 10 is an n-type silicon substrate with an impurity concentration in a range of about $1\times10^{15}$ cm$^{-3}$ to about $1\times10^{18}$ cm$^{-3}$. The mask layer includes, for example, a pad oxide (e.g., silicon oxide) layer and a silicon nitride mask layer in some embodiments.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range of about 5 nm to about 40 nm in some embodiments. In certain embodiments, the width of the hard mask patterns is in a range of about 7 nm to about 12 nm.

By using the hard mask pattern as an etching mask, the substrate 10 is patterned into fin structures 20 by trench etching using a dry etching method and/or a wet etching method. A height of the fin structure 20 is in a range of about 20 nm to about 300 nm. In certain embodiments, the height is in a range of about 30 nm to about 60 nm. When the heights of the fin structures are not uniform, the height from the substrate may be measured from the plane that corresponds to the average heights of the fin structures. The width of the fin structures 20 is in a range of about 7 nm to 15 nm.

In this embodiment, a bulk silicon wafer is used as a starting material and constitutes the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

As shown in FIG. 2, three fin structures 20 extending in the X direction are disposed adjacent to each other in the Y direction. However, the number of the fin structures is not limited to three. The numbers may be one, two, four or five or more. In addition, one of more dummy fin structures may be disposed adjacent to both sides of the fin structures 20 to improve pattern fidelity in patterning processes. The width of the fin structure 20 is in a range of about 5 nm to about 40 nm in some embodiments, and may be in a range of about 7 nm to about 15 nm in certain embodiments. The height of the fin structure 20 is in a range of about 100 nm to about 300 nm in some embodiments, and may be in a range of about 50 nm to 100 nm in other embodiments. The space between the fin structures 20 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits.

In this embodiment, the Fin FET device is an n-type Fin FET.

After forming the fin structures, an isolation insulating layer 50 is formed over the fin structures 20.

The isolation insulating layer 50 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

After forming the isolation insulating layer 50 over the fin structures 20, a planarization operation is performed so as to remove part of the isolation insulating layer 50 and the mask layer (the pad oxide layer and the silicon nitride mask layer). The planarization operation may include a chemical mechanical polishing (CMP) and/or an etch-back process. Then, the isolation insulating layer 50 is further removed so that an upper part of the fin structure 20, which is to become a channel layer 20A, is exposed, as shown in FIG. 2.

In certain embodiments, the partially removing the isolation insulating layer 50 may be performed using a wet etching process, for example, by dipping the substrate in hydrofluoric acid (HF). In another embodiment, the partially removing the isolation insulating layer 50 may be performed using a dry etching process. For example, a dry etching process using $CHF_3$ or $BF_3$ as etching gases may be used.

After forming the isolation insulating layer 50, a thermal process, for example, an anneal process, may be performed to improve the quality of the isolation insulating layer 50. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Figure 3:
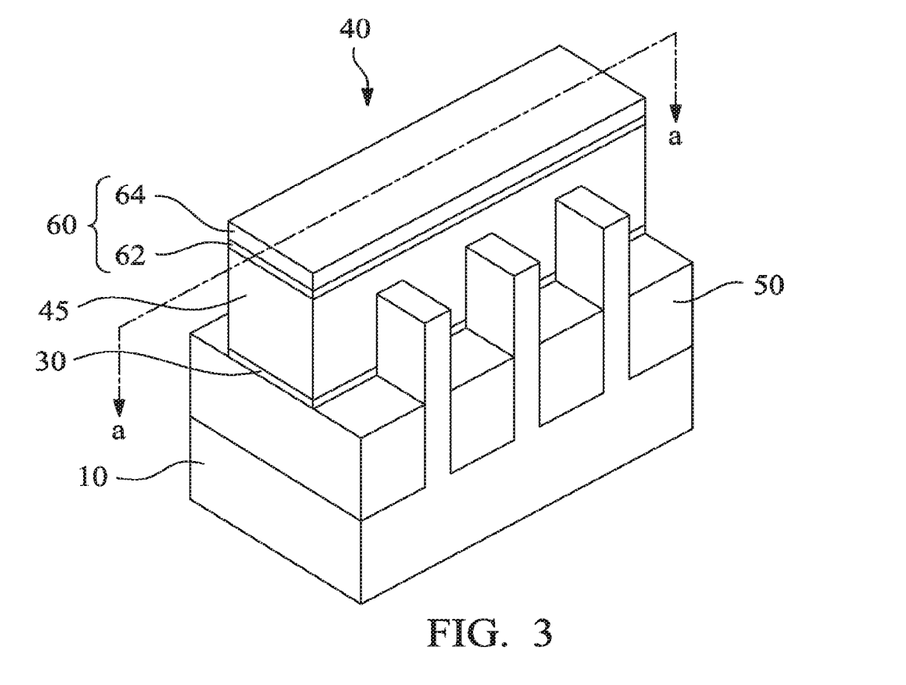
FIG. 3 shows one of the stages of manufacturing the Fin FET device according to an embodiment of the present disclosure.
Figure 4:
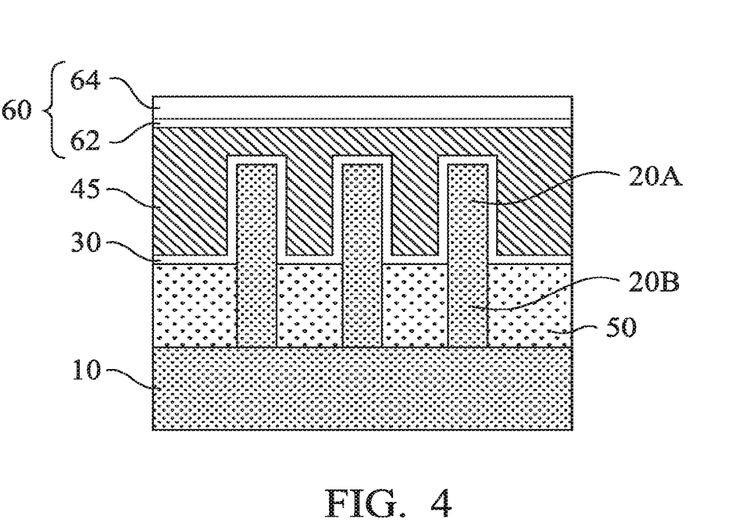
FIG. 4 shows one of the stages of manufacturing the Fin FET device according to an embodiment of the present disclosure.

In S103 of FIG. 1, a gate structure 40 is formed over part of the fin structures 20 as shown in FIG. 3. FIG. 3 is an exemplary perspective view of the Fin FET device at one of the various stages of the fabrication process according to one embodiment. FIG. 4 is an exemplary cross sectional view along the line a-a of FIG. 3.

A gate dielectric layer 30 and a poly silicon layer are formed over the isolation insulating layer 50 and the exposed fin structures 20, and then patterning operations are performed so as to obtain a gate structure including a gate electrode layer 45 made of poly silicon and a gate dielectric layer 30. The patterning of the poly silicon layer is performed by using a hard mask 60 including a silicon nitride layer 62 and an oxide layer 64 in some embodiments. In other embodiments, the layer 62 may be silicon oxide and the layer 64 may be silicon nitride. The gate dielectric layer 30 may be silicon oxide formed by CVD, PVD, ALD, e-beam evaporation, or other suitable process. In some embodiments, the gate dielectric layer 30 may include one or more layers of silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer is in a range of about 1 nm to about 5 nm. In some embodiments, the gate dielectric layer 30 may include an interfacial layer made of silicon dioxide.

In some embodiments, the gate electrode layer 45 may comprise a single layer or multilayer structure. The gate electrode layer 45 may be doped poly-silicon with uniform or non-uniform doping. In some alternative embodiments, the gate electrode layer 45 may include a metal such as Al, Cu, W, Ti, Ta, TiN, TiAl, TiAlN, TaN, NiSi, CoSi, other conductive materials with a work function compatible with the substrate material, or combinations thereof. The gate electrode layer 45 may be formed using a suitable process such as ALD, CVD, PVD, plating, or combinations thereof. In the present embodiment, the width of the gate electrode layer 45 is in the range of about 30 nm to about 60 nm. In some embodiments, a thickness of the gate electrode layer is in a range of about 30 nm to about 50 nm.

Figures 5, 6A:
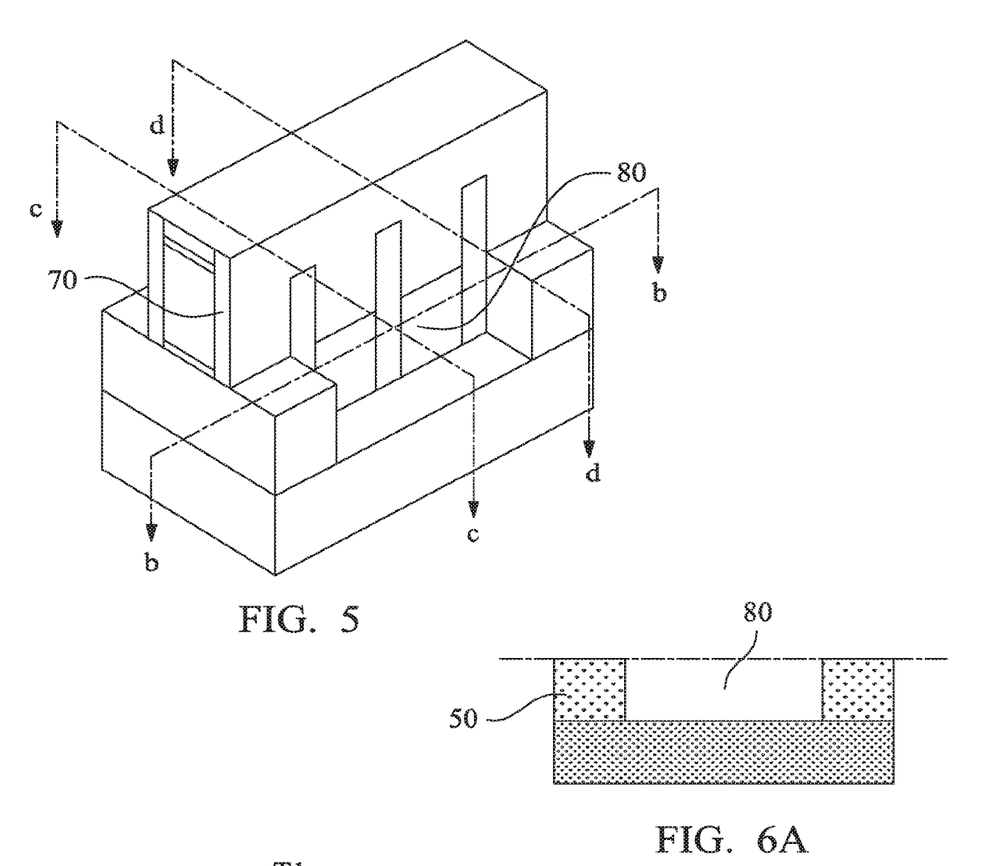
FIG. 5 shows one of the stages of manufacturing the Fin FET device according to an embodiment of the present disclosure.
FIGS. 6A, 6B and 6C show one of the stages of manufacturing the Fin FET device according to an embodiment of the present disclosure.
Figure 6B:
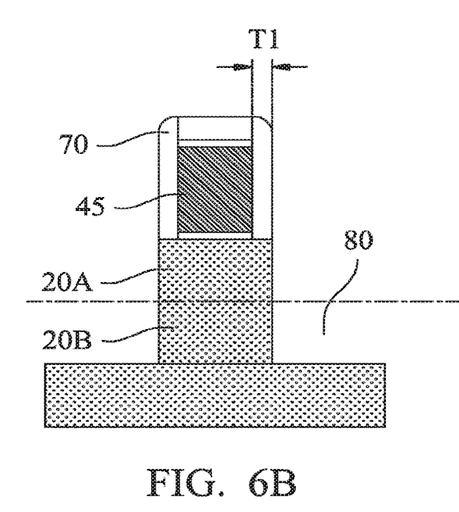
Figure 6C:
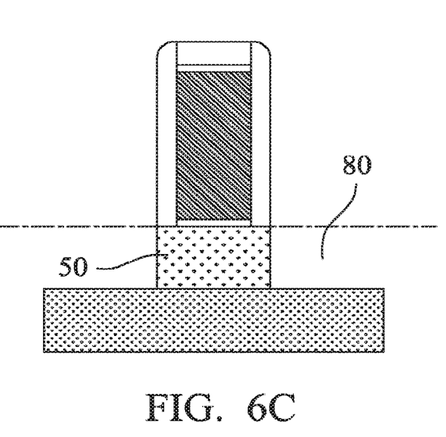

In S105 of FIG. 1, the fin structures 20 not covered by the gate structure 40 are etched down to form a recessed portion 80, as shown in FIG. 5. FIG. 5 is an exemplary perspective view of the Fin FET device at one of the various stages of the fabrication process according to one embodiment. FIG. 6A is an exemplary cross sectional views along the line b-b of FIG. 5, FIG. 6B is an exemplary cross sectional views along the line c-c of FIG. 5 cutting one of the fin structures, and FIG. 6C is an exemplary cross sectional views along the line d-d of FIG. 5 between the fin structures.

After the gate structure 40 is formed as shown in FIG. 4, side-wall insulating layers 70 are also formed at both main sides of the gate electrode layer 45. The side-wall insulating layers 70 may include silicon oxide, silicon nitride, silicon oxy-nitride, or other suitable material. The side-wall insulating layers 70 may comprise a single layer or multilayer structure. A blanket layer of a side-wall insulating material may be formed by CVD, PVD, ALD, or other suitable technique. Then, an anisotropic etching is performed on the side-wall insulating material to form a pair of side-wall insulating layers (spacers) 70 on two main sides of the gate structure. The thickness T1 of the side-wall insulating layers 70 is in a range of about 5 nm to about 15 nm in some embodiments.

The portion of fin structures 20 not covered by the gate structure 40 are etched down to form a recessed portion 80, as shown in FIG. 5. The fin structures are etched to the level of the substrate 10 such that the isolation insulating layer between the fin structures in the source/drain region are completely removed. By etching down to the level of the substrate 10, the fin structures 20 become a "merged" fin structure in the source/drain region. In certain embodiments, using the pair of side-wall insulating layers 70 as hard masks, a biased etching process is performed to recess the top surface of the fin structure 20 that are unprotected or exposed to form the recessed portion 80.

The etching to form the recess 80 includes anisotropic etching followed by isotropic etching. By the anisotropic etching, the fin structures 20 are mainly etched in the vertical direction (Z direction). After the anisotropic etching, the isotropic etching is performed to etch the fin structures under the gate structure 40.

Figure 7A:
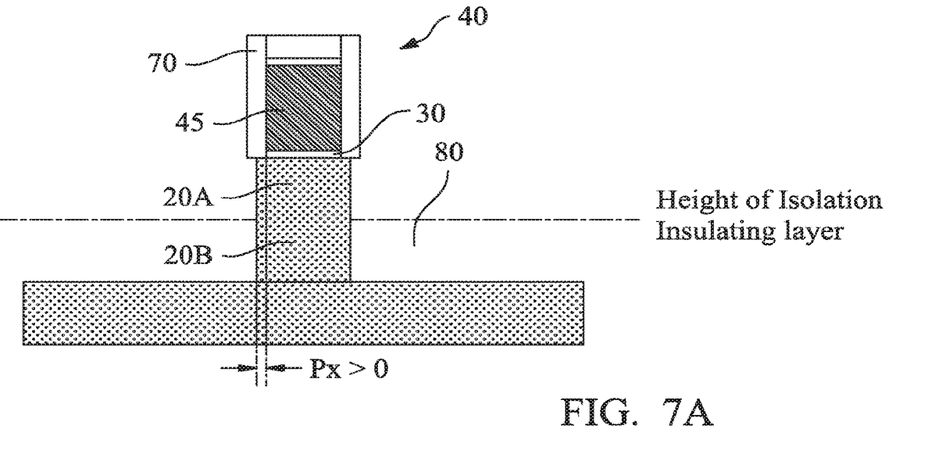
FIGS. 7A, 7B and 7C show one of the stages of manufacturing the Fin FET device according to an embodiment of the present disclosure.
Figure 7B:
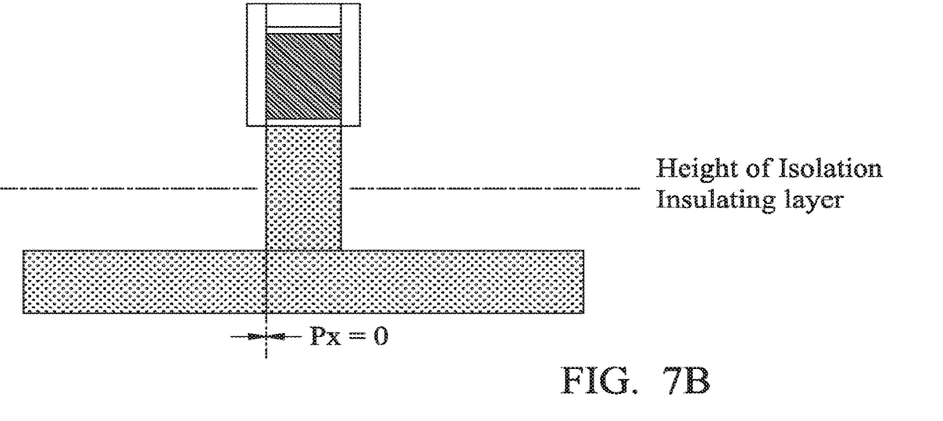
Figure 7C:
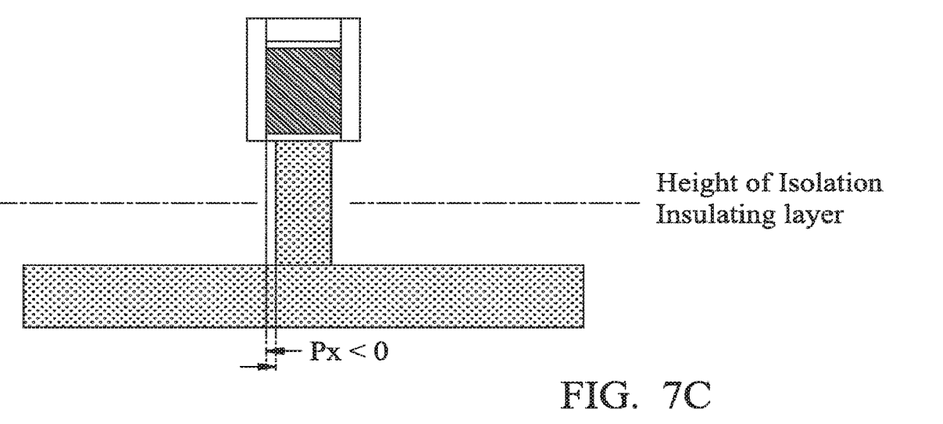

FIGS. 7A-7C show exemplary cross sectional views of the Fin FET device after the isotropic etching of the fin structure.

By adjusting etching conditions (e.g., etching time), an amount of etching under the gate structure 40 can be controlled, and therefore a proximity Px between the gate electrode layer and a source/drain epitaxial layer can be controlled. The proximity Px between the gate electrode layer and a source/drain epitaxial layer is defined a distance from a line extending from a side wall of the gate electrode layer to a surface of the fin structure in the recess 80.

In FIG. 7A, the proximity Px is positive and is more than 0 and less than 10 nm. In some embodiments, Px is in a range of about 1 nm to about 7 nm.

In FIG. 7B, the proximity Px is substantially 0 nm.

In FIG. 7C, the proximity Px is negative and is more than about −2 nm and less than 0 nm. In some embodiments, Px is in equal to or more than about −1 nm and less than 0 nm (1 nm≤Px<0 nm).

In one embodiment of the present disclosure, the etching conditions in the recess etching process are adjusted to achieve desired etching profiles. For example, transform coupled plasma (TCP) with process gases including $CH_4$, $CHF_3$, $O_2$, HBr, He, $Cl_2$, $NF_3$, and/or $N_2$ is used with changing power and/or bias conditions. The TCP etching includes anisotropic etching followed by isotropic etching. In the isotropic etching, the bias voltage is set smaller than that in the anisotropic etching. By the isotropic etching, the fin structures are horizontally etched under the gate structure 40.

In S107 of FIG. 1, a dislocation structure is formed in the substrate 10.

Figure 8:
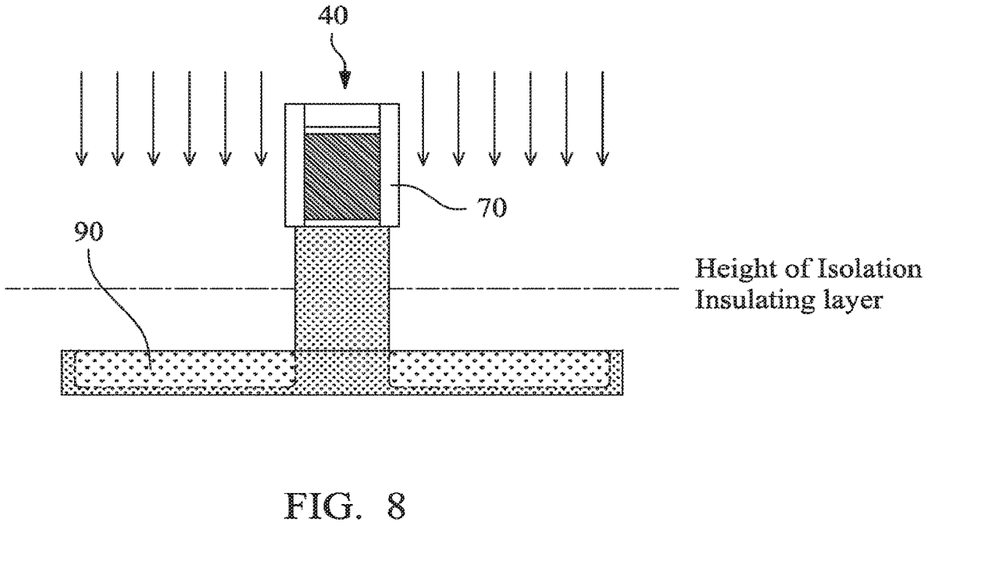
FIG. 8 shows one of the stages of manufacturing the Fin FET device according to an embodiment of the present disclosure.

As shown in FIG. 8, a pre-amorphous implantation (PAI) operation is performed. The PAI operation implants the substrate 10, damaging a lattice structure of the substrate 10 and forming an amorphized region 90. In the present embodiment, the amorphized region 90 is formed in a source and drain region of the Fin FET device 200 and slightly penetrates under the gate structure 40. A depth of the amorphized region 90 is determined according to design specifications, and may range from about 10 nm to about 150 nm. In the present embodiment, the depth of the amorphized region 90 is less than about 100 nm. The depth of the amorphized region 90 can be controlled by the thickness of the side-wall insulating layers 70, because the side-wall insulating layers 70 serve to concentrate the implantation energy away from the center of the gate structure 40; thereby allowing for a deeper amorphized depth. Also, the depth of the amorphized region 90 can be controlled by implantation energy, implantation species, and/or an implantation dosage. In the present embodiment, the implantation species (ions) is silicon (Si) and/or germanium (Ge). Alternatively, the implantation species may be Ar, Xe, $BF_2$, As, In, other suitable implant species, or combinations thereof. In the present embodiment, Si or Ge is implanted at implant energy from about 20 KeV to about 60 KeV, and a dosage ranging from about $1 \times 10^{14}$ atoms/cm$^2$ to about $2 \times 10^{15}$ atoms/cm$^2$, depending on the implantation temperature. Lower implantation temperature will enhance implant amorphization efficiency.

A patterned photoresist layer may be utilized to define where the amorphized region 90 is formed and protect other regions of the Fin FET device from implantation damage. For example, the patterned photoresist layer exposes the source/drain regions, such that the source/drain regions are exposed to the PAI operation while the gate structure 40 (and other portions of the Fin FET device) is protected from the PAI operation. Alternatively, a patterned hard mask layer, such as a SiN or SiON layer, is utilized to define the amorphized region 90. The patterned photoresist layer or the patterned hard mask layer may be part of the current manufacturing process (e.g., LDD or source/drain formation), thereby minimizing cost as no additional photoresist layer or hard mask is required for the PAI operation.

Figure 9:
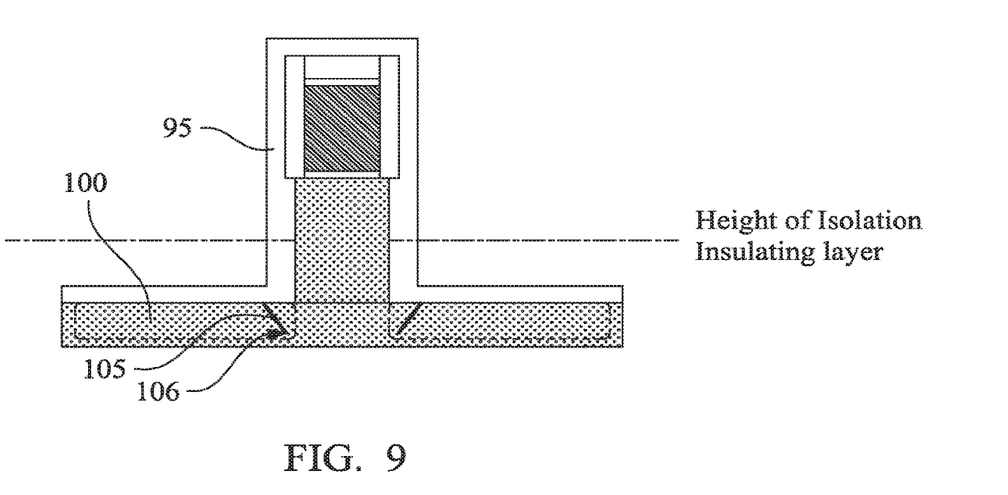
FIG. 9 shows one of the stages of manufacturing the Fin FET device according to an embodiment of the present disclosure.

As shown in FIG. 9, a stress film 95 is deposited over the resultant structure. The stress film 95 may be formed by chemical vapor deposition (CVD), physical vapor deposition (PVD), atomic layer deposition (ALD), high density plasma CVD (HDPCVD), plating, other suitable methods, and/or combinations thereof. The stress film 95 may include a dielectric material, such as silicon nitride, silicon oxide, silicon oxynitride, other suitable materials, and/or combinations thereof. The stress film 95 is used to provide stress in a subsequent annealing operation which recrystallizes the amorphized region 90.

Still referring to FIG. 9, an annealing operation is performed on the resultant structure. The annealing operation causes the amorphized region 90 to re-crystallize, forming a re-crystallized region 100. The annealing operation may be a rapid thermal annealing (RTA) process or a millisecond thermal annealing (MSA) process (for example, a millisecond laser thermal annealing operation).

The annealing operation may include a long range preheat which minimizes or even eliminates end of range (EOR) defects. The long range pre-heat may be performed at a temperature from about 200° C. to about 700° C. The long range pre-heat may be performed for about 50 to about 300 seconds. The annealing operation may be performed at a temperature from about 500° C. to about 1,400° C. Also, depending on the type of annealing operation and the temperature utilized, the annealing operation may be performed for about 1 millisecond to about 5 seconds. In the present embodiment, the long range pre-heat has a temperature of about 550° C. for about 180 seconds. Also, in the present embodiment, the annealing operation is a RTA process, utilizing a temperature greater than about 1000° C. and is performed for more than 1.5 seconds. In some embodiments, the annealing operation is a MSA process, utilizing a temperature up to the Si melting point of about 1,400° C. and is performed for a few milliseconds or less, for example for about 0.8 milliseconds to about 100 milliseconds.

During the annealing operation, as the amorphized region 90 recrystallizes, dislocations 105 are formed in the recrystalized region 100. The dislocations 105 are formed in the <111> direction of the Si substrate 10. The <111> direction has an angle of about 45 to about 65 degrees, the angle being measured with respect to an axis parallel to a surface of the substrate 10. In the present embodiment, the dislocations 105 have the <111> direction with an angle of about 55 degrees, the angle being measured with respect to an axis parallel to the surface of the substrate 10.

The dislocations 105 start formation at pinchoff points 106. The pinchoff points 106 are formed in the re-crystalized region 100 at a depth of about 10 to about 150 nm, the depth being measured from the bottom surface of the recess 80. The pinchoff points 106 may be formed such that they are not disposed under the gate structure 40 and under the fin structure 20 (channel layer 20A).

After the annealing operation, the stress film 95 is removed by, for example, wet etching. Phosphoric acid or hydrofluoric acid may be used in the wet etching. In some embodiments, dry etching may be used.

In S109 of FIG. 1, a source and a drain are formed by epitaxial growth of suitable materials. By using materials different from the channel layer 20A as a source and a drain, the channel layer is appropriately strained, thereby increasing carrier mobility in the channel layer.

Figure 10A:
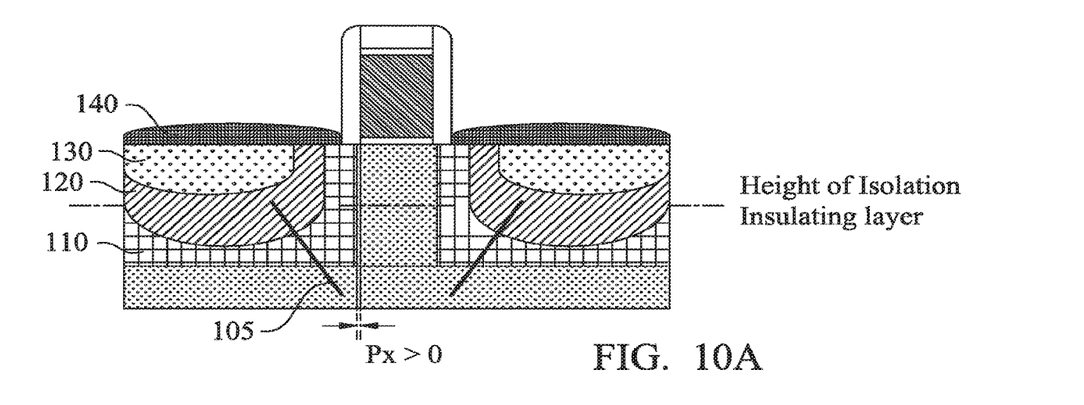
FIGS. 10A, 10B and 10C show one of the stages of manufacturing the Fin FET device according to an embodiment of the present disclosure.
Figure 10B:
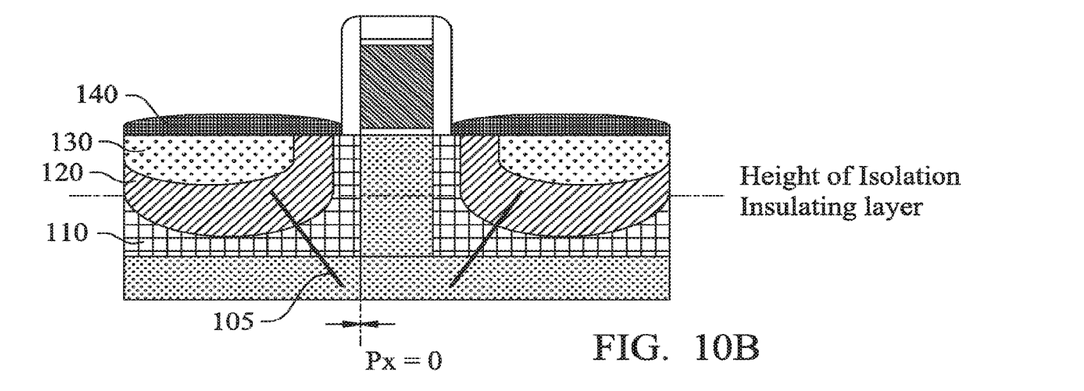
Figure 10C:
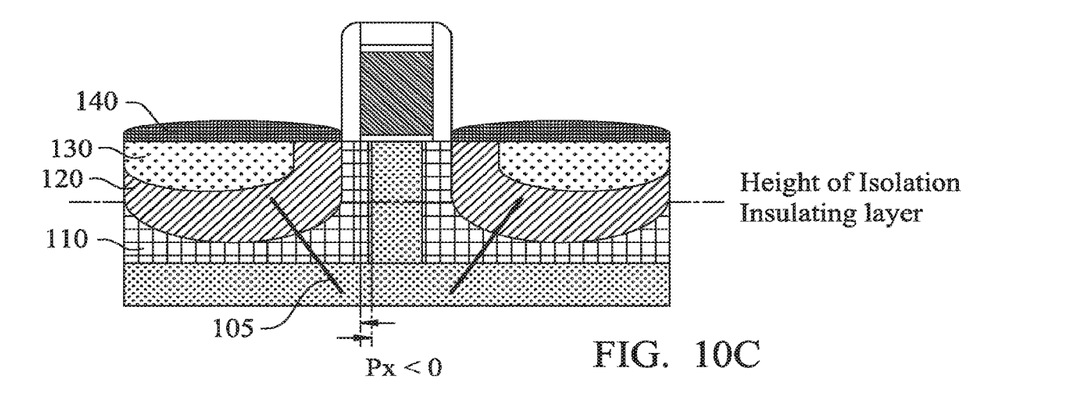

FIGS. 10A-10C show exemplary cross sectional views after the epitaxial layers for the source and drain are formed corresponding to the structures of FIGS. 7A-7C, respectively.

A first epitaxial layer 110 is formed over the bottom of the recess 80, i.e., exposed substrate 10. The first epitaxial layer 110 functions as a channel stressor for applying tensile stress to the channel layer 20A. The first epitaxial layer 110 includes SiCP in the present embodiment. A carbon concentration in SiCP determined by an X-ray diffraction (XRD) method is in a range about 1% to 5%. In some embodiments, the carbon concentration is in a range of about 1.2% to about 4%, and may be in a range of about 2% to about 3% in other embodiments. An amount of P (phosphorus) in the SiCP is in a range about $1 \times 10^{18}$ cm$^{-3}$ to about $1 \times 10^{20}$ cm$^{-3}$. The thickness of the first epitaxial layer 110 is in a range of about 5 nm to 20 nm in this embodiment, and in a range of about 5 nm to about 15 nm in other embodiments.

Since the first epitaxial layer 110, which is in direct contact with the fin structure 20 (the channel layer 20A and the well layer 20B), as shown in FIGS. 10A-10C, contains carbon, the carbon can trap the Si and P interstitials and suppress diffusion of phosphorus in the SiCP first epitaxial layer 110 into the channel layer 20A, thereby suppressing a short channel effect. The resistivity of the first epitaxial layer is in a range about 0.8 to 1.2 mΩ·cm.

In general, as the proximity Px is decreased to enhance the effect of channel stressor, the short channel effect becomes worse. However, when the SiCP first epitaxial layer includes carbon to suppress diffusion of phosphorus, it is possible to decrease the proximity Px, as shown in FIGS. 10A-10C.

In FIG. 10A, the proximity Px is positive and is more than 0 and less than 10 nm. In some embodiments, Px is in a range of about 1 nm to about 7 nm. In FIG. 10A, the interface between the channel layer 20 and the source/drain epitaxial layers is located directly under the side-wall insulating layer.

In FIG. 10B, the proximity Px is substantially 0 nm. In FIG. 10B, the interface between the channel layer 20 and the source/drain epitaxial layers is located directly under the interface between the side-wall insulating layer and the gate electrode layer.

In FIG. 10C, the proximity Px is negative and is more than about −2 nm and less than 0 nm. In some embodiments, Px is equal to or more than about −1 nm and less than 0 nm (−1 nm≤Px<0 nm). In FIG. 10C, the interface between the channel layer 20 and the source/drain epitaxial layers is located directly under the gate electrode layer.

The proximity between the gate electrode layer and a source/drain epitaxial layer can be defined in another way. For example, the condition "Px>0" corresponds to a condition where the width Wc of the channel layer 20A satisfies "the width Wg of the gate electrode layer"<Wc<Wg+2×"the thickness T of the side-wall insulating layer." The condition "Px=0" corresponds to a condition "Wc=Wg. The condition "Px<0" corresponds to a condition "Wc<Wg."

After forming the first epitaxial layer 110, a second epitaxial layer 120 is formed over the first epitaxial layer 110. The second epitaxial layer 120 functions as a main channel stressor for applying tensile stress to the channel layer 20A. The second epitaxial layer 120 includes SiCP in the present embodiment. A carbon concentration in SiCP of the second epitaxial layer 120 defined by XRD is less than the carbon concentration of the SiCP first epitaxial layer 110 and is in a range about 0.7% to 3%. In some embodiments, the carbon concentration is in a range of about 1% to about 3%, and may be in a range of about 1.2% to about 2.5% in other embodiments. An amount of phosphorus in the SiCP second epitaxial layer is higher than the phosphorus amount of the SiCP first epitaxial layer 110 and is in a range about $1 \times 10^{20}$ $cm^{-3}$ to about $2 \times 10^{20}$ $cm^{-3}$. The thickness of the second epitaxial layer 120 is in a range of about 20 nm to 40 nm in this embodiment, or in a range of about 25 nm to about 35 nm in other embodiments. The resistivity of the second epitaxial layer is in a range about 0.3 to 1.0 mΩ·cm.

During the formation of the first epitaxial layer 110 and the second epitaxial layer 120, the dislocation 105 formed in the substrate 10 grows into the first epitaxial layer 110 and the second epitaxial layer 120. The dislocation 105 formed in the first epitaxial layer 110 and the second epitaxial layer 120 is an additional source of a stressor to the channel layer 20A.

After forming the second epitaxial layer 120, a third epitaxial layer 130 may be formed over the second epitaxial layer 120. The third epitaxial layer 130 also functions as a channel stressor for applying tensile stress to the channel layer 20A. The third epitaxial layer 130 includes SiP in the present embodiment. The SiP layer may include pseudo-cubic $Si_3P_4$. An amount of phosphorus in the SiP third epitaxial layer 130 is higher than the phosphorus amount of the SiCP second epitaxial layer 120 and is in a range of about $1 \times 10^{21}$ $cm^{-3}$ to about $1 \times 10^{22}$ $cm^{-3}$ in some embodiments, and in a range of about $2 \times 10^{21}$ $cm^{-3}$ to about $5 \times 10^{21}$ $cm^{-3}$ in other embodiments. The thickness of the third epitaxial layer 130 is in a range of about 1 nm to 25 nm in some embodiments, and in a range of about 2 nm to about 10 nm in other embodiments.

The upper surface of the third epitaxial layer 130 may be the same as the height of upper surface of the fin structure under the gate structure or may be located at slightly higher (about 1 nm to about 5 nm) than the fin structure under the gate structure.

By using the multi-layer stressor structure of the first to third epitaxial layers, it is possible to suppress a short channel effect, to increase the stress applied to the channel layer.

In the above embodiment, the number of the epitaxial layer is only three. In some embodiments, an additional epitaxial layer may be formed over the third epitaxial layer. The additional epitaxial layer may include SiP containing boron. An amount of boron in the additional epitaxial layer may be higher than the boron amount of the third epitaxial layer.

Further, a fourth layer 140 may be formed over the third epitaxial layer 130. The fourth layer 140 may include a SiP epitaxial layer. The fourth layer 140 is a sacrificial layer for a silicide formation in the source/drain. An amount of phosphorus in the SiP fourth layer 140 is less than the phosphorus amount of the SiCP third epitaxial layer 130 and is in a range of about $1 \times 10^{18}$ $cm^{-3}$ to about $1 \times 10^{20}$ $cm^{-3}$ in some embodiments.

In at least one embodiment, the epitaxial layers 110-140 are epitaxially-grown by an LPCVD process or an atomic layer deposition method. The LPCVD process is performed at a temperature of about 400 to 800° C. and under a pressure of about 1 to 200 Torr, using silicon source gas such as $SiH_4$, $Si_2H_6$, or $Si_3H_8$, carbon source gas such as $CH_4$ or $SiH_3CH$ and phosphorus source gas such as $PH_3$.

In the above embodiment, in the recess etching, the fin structures are etched by dry etching. Instead of dry etching, wet etching may be performed.

Figure 11:
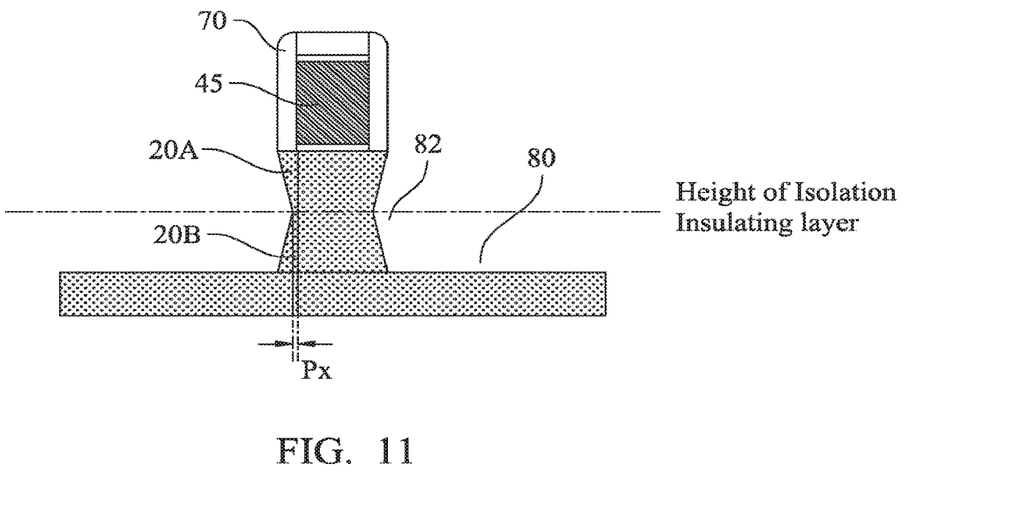
FIGS. 11 and 12 show exemplary processes for manufacturing the Fin FET device according to another embodiment of the present disclosure.

The wet etching may be performed by using TMAH (tetramethylammonium hydroxide). In the wet etching of silicon by TMAH, an etching rate in the Si (100) face is faster than an etching rate in the Si (111) face. Accordingly, when the substrate 10 is a (100) silicon crystal substrate and the fin structures are etched by TMAH, the cross sectional view of the recess 80 has oblique end profiles 82 as shown in FIG. 11. By adjusting the etching conditions, the location of the end portion 82 can be adjusted, thereby adjusting the proximity Px.

Figure 12:
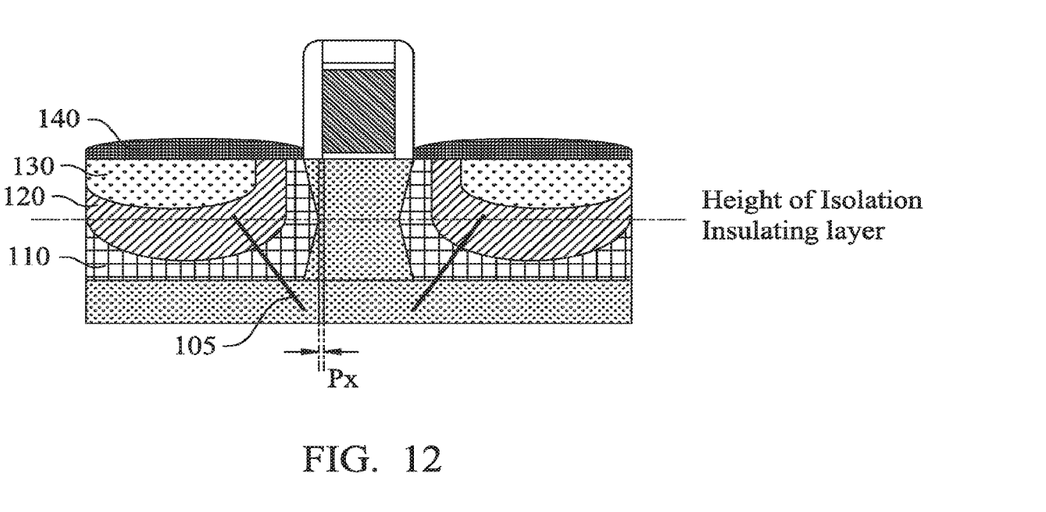

As shown in FIG. 12, the first to third epitaxial layers and the fourth layer are formed in the recess 80 formed by the TMAH wet etching. In some embodiments, dry etching and wet etching may be combined.

In the above embodiments, plural fin structures are "merged" in the recess etching. However, the structures and manufacturing operations as set forth above may be applied to a Fin FET device with a single fin structure or a Fin FET device having multiple fins without "merged" source/drain structure. In the Fin FET device having multiple fins without "merged" source/drain structure, the recess etching may be performed to the level of the substrate or may finish before reaching the substrate.

It is understood that the Fin FET device may undergo further CMOS processes to form various features such as contacts/vias, interconnect metal layers, dielectric layers, passivation layers, etc. The modified insulation and strained structure provides a given amount of strain into channel layer 20A of the Fin FET, thereby enhancing the device performance.

The various embodiments or examples described herein offer several advantages over the existing art. For example, by reducing the proximity between the gate electrode layer and a source/drain epitaxial layer (first epitaxial layer), while including carbon in the first epitaxial layer, it is possible to suppress a short channel effect caused by diffusion of phosphorus into the channel layer, and to increase the stress applied to the channel layer.

It will be understood that not all advantages have been necessarily discussed herein, no particular advantage is required for all embodiments or examples, and other embodiments or examples may offer different advantages.

In accordance with one aspect of the present disclosure, a semiconductor device includes a Fin FET. The Fin FET includes a fin structure disposed over a substrate. The fin structure includes a channel layer and extends in a first direction. The Fin FET also includes a gate structure including a gate electrode layer and a gate dielectric layer, covering a portion of the fin structure and extending in a second direction perpendicular to the first direction. The gate structure further includes side-wall insulating layers disposed over both main sides of the gate electrode layer. The Fin FET further includes a source and a drain, each including a stressor layer disposed in a recess not covered by the gate structure. The stressor layer includes a first stressor layer, a second stressor layer overlying the first stressor layer and a third stressor layer overlying the second stressor layer. In the source, an interface between the first stressor layer and the channel layer is located under one of the side-wall insulating layers closer to the source or the gate electrode.

In accordance with another aspect of the present disclosure, a semiconductor device includes a Fin FET. The Fin FET includes a fin structure disposed over a substrate. The fin structure includes a channel layer and extending in a first direction. The Fin FET also includes a gate structure including a gate electrode layer and a gate dielectric layer, covering a portion of the fin structure and extending in a second direction perpendicular to the first direction. The gate structure further includes side-wall insulating layers disposed over both main sides of the gate electrode layer. The Fin FET further includes a source and a drain, each including a stressor layer disposed in a recess not covered by the gate structure. The stressor layer includes a first stressor layer, a second stressor layer overlying the first stressor layer and a third stressor layer overlying the second stressor layer. In the source, an interface between the first stressor layer and the channel layer is located under one of the side-wall insulating layers closer to the source or the gate electrode. A width of the channel layer along the first direction is smaller than a sum of a width of the gate electrode and widths of the side-wall insulating layers along the first direction.

In accordance with another aspect of the present disclosure, a method for manufacturing a semiconductor device includes forming a fin structure over a substrate. The fin structure includes a channel layer exposed from an isolation insulating layer, and extends in a first direction. A gate structure including a gate electrode layer and a gate dielectric layer is formed over part of the fin structure. The gate structure extends in a second direction perpendicular to the first direction. The gate structure further includes side-wall insulating layer disposed over both main sides of the gate electrode layer. A recess is formed by removing part of the fin structure not covered by the gate structure. A source and a drain are formed in the recess, each including a stressor layer. The stressor layer includes a first stressor layer, a second stressor layer formed over the first stressor layer and a third stressor layer formed over the second stressor layer. The recess is formed such that, in the source, an interface between the first stressor layer and the channel layer is located under one of the side-wall insulating layers closer to the source or the gate electrode.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a Fin FET including:
an isolation insulating layer disposed over a substrate;
a fin structure disposed over the substrate, the fin structure including a channel region and extending in a first direction;
a gate structure including a gate electrode layer and a gate dielectric layer covering a portion of the fin structure and extending in a second direction perpendicular to the first direction; and
a source and a drain, each including a semiconductor epitaxial layer;
wherein:
the semiconductor epitaxial layer includes a first epitaxial layer, a second epitaxial layer disposed on the first epitaxial layer and a third epitaxial layer disposed on the second epitaxial layer,
a cover layer is disposed to contact the second epitaxial layer and the third epitaxial layer, and
a bottommost portion of the second epitaxial layer is located below an upper surface of the isolation insulating layer and a bottommost portion of the third epitaxial layer is located above the upper surface of the isolation insulating layer.

2. The semiconductor device of claim 1, wherein:
the first epitaxial layer includes SiCP,
the second epitaxial layer includes SiCP, and
a concentration of carbon in the first epitaxial layer is greater than a concentration of carbon in the second epitaxial layer.

3. The semiconductor device of claim 2, wherein an amount of phosphorus in the second epitaxial layer is greater than an amount of phosphorus in the first epitaxial layer.

4. The semiconductor device of claim 3, wherein:
the third epitaxial layer includes SiP, and
an amount of phosphorus in the third epitaxial layer is greater than the amount of phosphorus in the second epitaxial layer.

5. The semiconductor device of claim 1, further comprising a dislocation extending from the substrate to the semiconductor epitaxial layer.

6. The semiconductor device of claim 5, wherein the dislocation passes through the first epitaxial layer and stops within the second epitaxial layer.

7. The semiconductor device of claim 1, wherein:
the gate structure further includes sidewall insulating layer disposed on and in direct contact with a sidewall of the gate electrode layer, and
in the source, an interface between the first epitaxial layer and the channel region is located under the sidewall insulating layer.

8. The semiconductor device of claim 1, wherein:
the gate structure further includes sidewall insulating layer disposed on and in direct contact with a sidewall of the gate electrode layer, and
in the source,
the first epitaxial layer and the third epitaxial layer are separated by the second epitaxial layer,
a first interface between the first epitaxial layer and the channel region is located under the sidewall insulating layer,
the first epitaxial layer is in direct contact with a bottom of the sidewall insulating layer, and
a second interface between the second epitaxial layer and the third epitaxial layer includes a lateral portion and a vertical portion and the vertical portion is not located under the gate structure.

9. The semiconductor device of claim 8, wherein, in the source, the first interface is located directly under the sidewall insulating layer.

10. The semiconductor device of claim 8, wherein, in the source, the first interface is located at a plane extending from a third interface of the gate electrode layer and the sidewall insulating layer.

11. The semiconductor device of claim 8, wherein, in the source:
the first interface is located directly under the gate electrode layer, and
a distance between the first interface and a plane extending from an interface of the gate electrode layer and the sidewall insulating layer is equal to or less than 1 nm.

12. A semiconductor device, comprising:
a Fin FET including a source and a drain, each including a multilayer semiconductor layer, wherein:
the multilayer semiconductor layer includes a first layer, a second layer overlying the first layer, a third layer overlying the second layer and a cover layer contacting the second layer and the third layer,
the second and third layers are separated from a channel of the Fin FET by the first layer,
the first layer includes SiCP,
the second layer includes SiCP with a carbon concentration less than a carbon concentration of the first layer,
the third layer includes SiP with a phosphorous amount higher than a phosphorus amount of the second layer, and
the cover layer includes SiP with a phosphorous amount less than the phosphorus amount of the third layer.

13. The semiconductor device of claim 12, wherein:
the Fin FET further comprises a fin structure disposed over a substrate, the fin structure including a channel region protruding from an isolation insulating layer, and
a bottommost portion of the second layer is located below an upper surface of the isolation insulating layer and a bottommost portion of the third layer is located above the upper surface of the isolation insulating layer.

14. The semiconductor device of claim 13, further comprising a dislocation extending from the substrate to the multilayer semiconductor layer.

15. The semiconductor device of claim 14, wherein the dislocation passes through the first layer and stops within the second layer.

16. The semiconductor device of claim 13, wherein:
the Fin FET further comprises a gate structure including a gate electrode layer, a gate dielectric layer and side-wall insulating layers disposed over both main sides of the gate electrode layer, and
a width of the channel region is smaller than a sum of a width of the gate electrode layer and widths of the side-wall insulating layers.

17. A semiconductor device including a Fin FET, comprising:
a fin structure disposed over a substrate, the fin structure including a channel region and protruding from an isolation insulating layer; and
a source and a drain, each including multiple epitaxial semiconductor layers, wherein:
the multiple epitaxial semiconductor layers include a first layer, a second layer overlying the first layer and a third layer overlying the second layer,
the Fin FET includes a dislocation extending from the substrate, passing through the first layer and stopping within the second layer, and
a starting point of the dislocation is closer to the channel region than an end point of the dislocation.

18. The semiconductor device of claim 17, further comprising a gate structure including a gate electrode layer, a gate dielectric layer and side-wall insulating layers disposed over both main sides of the gate electrode layer,
wherein an interface between the first layer and the second layer is not located under the gate structure.

19. The semiconductor device of claim 18, wherein the first layer is located just below the gate dielectric layer.

* * * * *